United States Patent [19]

Loo

[11] Patent Number: 4,628,512
[45] Date of Patent: Dec. 9, 1986

[54] ADDRESS DISTRIBUTION IN DATA STORAGE APPARATUS

[75] Inventor: Johnson Loo, Newcastle-under-Lyme, England

[73] Assignee: International Computers Limited, London, England

[21] Appl. No.: 690,726

[22] Filed: Jan. 11, 1985

[30] Foreign Application Priority Data

Jan. 24, 1984 [GB] United Kingdom ............... 8401806

[51] Int. Cl.$^4$ .............................................. G06F 11/10
[52] U.S. Cl. ......................................... 371/68; 371/21
[58] Field of Search ................... 371/19, 20, 8, 11, 25, 371/67, 68, 51

[56] References Cited

U.S. PATENT DOCUMENTS 3,944,800  3/1976  Beck ...................................... 371/68
3,982,111  9/1976  Lerner ................................... 371/68
4,031,523  6/1977  Horsten ............................... 365/206
4,245,344  1/1981  Richter ................................ 371/68
4,400,792  8/1983  Strelow ............................... 371/68

Primary Examiner—Michael R. Fleming
Attorney, Agent, or Firm—Lee, Smith & Zickert

[57] ABSTRACT

In a data storage apparatus, memory chips are arranged in groups, each group having an address bus which is connected to the address inputs of all the chips in that group. Each address bus is terminated at both ends by circuits which perform the dual function of suppressing reflections and checking the addresses.

Because reflections are suppressed, the time taken to address the store is reduced. One of the termination circuits in each group is arranged to compare the address on the bus with that on the bus in the adjacent group; the other circuit compares the address with a predetermined value.

3 Claims, 1 Drawing Figure

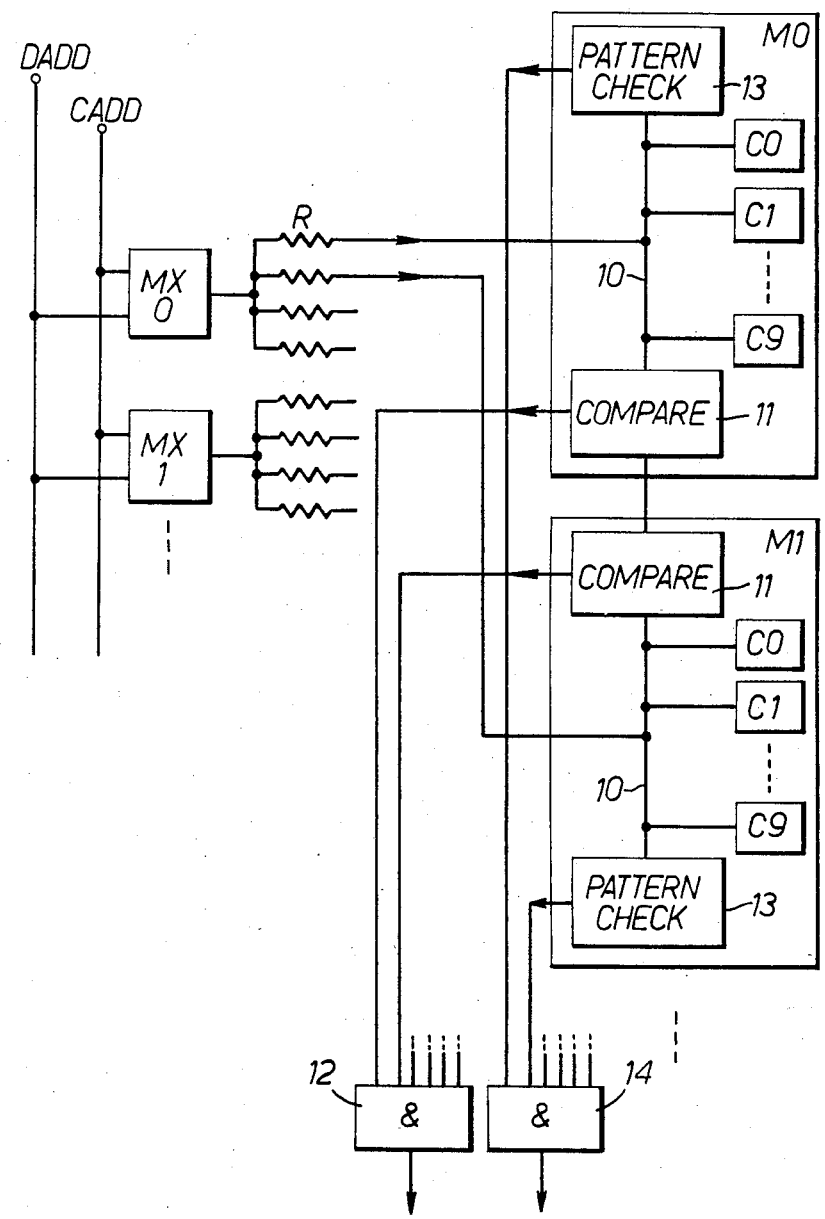

ADDRESS DISTRIBUTION IN DATA STORAGE APPARATUS

BACKGROUND OF THE INVENTION

This invention relates to data storage apparatus.

One factor which limits the speed of operation of a data store is the time taken to distribute the required address to the individual storage chips from which the store is constructed. The object of the present invention is to provide a way of reducing this time.

SUMMARY OF THE INVENTION

According to the invention, there is provided data storage apparatus comprising a plurality of memory chips and an address bus connected in parallel to the address inputs of all the chips wherein the address bus is terminated at each end by a termination circuit which suppresses signal reflections on the bus and also performs checking operations on the address.

Because the termination circuits suppresses signal reflections, the address does not need to be held on the bus for such a long period and hence the cycle time of the store can be reduced. Since the termination circuits also act as checking circuits, they represent an economical use of logic circuits.

In one arrangement in accordance with the invention, the memory chips are arranged in a plurality of groups, each group having a separate address bus connected in parallel to the address inputs of all the chips in that group, an address signal being distributed to all the busses in parallel, and each bus having a termination circuit at each end. Preferably one of the termination circuits associated with each bus compares the address on that bus with the address on the bus in the adjacent group of memory chips. This test can be performed continuously during normal operation of the store. The other of the termination circuits may compare the address on the bus with a predetermined value. This can be used during diagnostic tests, in which the predetermined value is used to address the memory.

BRIEF DESCRIPTION OF THE DRAWINGS

One data storage apparatus in accordance with the invention will now be described by way of example with reference to the accompanying drawing which is a block diagram of the apparatus.

DESCRIPTION OF THE PREFERRED EMBODIMENT OF THE INVENTION

Referring to the drawing, the data store comprises sixteen memory modules M0-M15. Each of these modules contains nine random-access memory (RAM) chips C0-C8. Each chip has 16384 (16K) individually addressable bit locations. The store is organised to provide an overall storage capacity of 64K data words, each word having 36 bits (32 data bits and four parity bits).

The store is addressed by a 16-bit address signal. The two most significant bits of the address are used to select the particular set of four modules in which the desired data word is located. The remaining 14 bits are distributed to all the chips in parallel, so as to select one bit from each chip.

The store address is obtained from one of two possible sources: a data address DADD or a code address CADD, the latter being used when accessing code (i.e. program instructions) in the store. The two source addresses are applied in parallel to a set of four multiplexers MX0-MX3. All those multiplexers are operated in parallel so that, in a first state, they all select DADD and, in a second state, they all select CADD.

The way in which the address bits are distributed to the chips will now be described. The output of each multiplexer MX0-3 is fanned out to four of the memory modules. The fan-out paths from the multiplexers contain 20 ohm resistors R for the purpose of damping oscillations. It will be appreciated that each path shown in the drawing actually consists of fourteen parallel bit lines, one for each address bit. Therefore, each resistor R shown in the drawing actually represents a group of fourteen such resistors, one in each bit line.

Within each module, the address is distributed to the nine chips C0-C8 by way of an internal address bus 10. One end of this bus is terminated by a comparator circuit 11, which continuously compares the address on that bus with the address on the bus in the adjacent module: that is, the address in module M0 is compared with that in M1, the address in module M2 is compared with that in M3, and so on. The outputs of all the comparators 11 are combined in an AND gate 12, to produce an overall check signal. It will be appreciated that, if there are no faults in the address distribution circuit, the addresses on all the busses 10 should be the same, and hence all the comparators 11 should detect equality, and the AND gate 12 enabled. This test is performed during normal operation of the store.

The other end of each bus 10 is terminated by a pattern checking circuit 13 which compares the address on that bus with a fixed predetermined test pattern, this pattern being the same for all the modules M0-M15. The test pattern may, for example, be an "all ones" pattern. The results from all the circuits 13 are combined in an AND gate 14 to produce an overall check signal.

From time to time the addressing of the chips may be checked by applying the predetermined test pattern to the address input of the store. If this address is correctly received by all the busses 10, the check circuits 13 will all detect equality, and hence the AND gate 14 will be enabled. This test is capable of detecting the failure of one of the multiplexers MX0-3, which would not be detectable by the comparison check of circuits 11.

The comparators 11 and pattern checking circuits 13 are all constructed from Schottky transistor-transistor logic (STTL) and provide terminations for the internal busses 10 which, along with the resistors R, suppress reflections on the busses. This elimination of reflections enables the address busses to be operated at a faster clock rate, thus reducing the cycle time of the store. For example, the invention is capable of reducing the store cycle time from 120 nanoseconds to 60 nanoseconds.

It should be noted that, instead of using a plurality of multiplexers MX0-MX3 as shown, it would have been possible to use a single multiplexer to select the desired address, and then to feed the output of this multiplexer to a plurality of driver circuits, to fan the address out to all the modules. However, this would introduce an extra logic delay into the address path. By using a plurality of multiplexers as shown, the need for the driver circuits is eliminated and hence the addressing is speeded up.

I claim:
1. Data storage apparatus comprising:
 (a) a plurality of groups of memory chips, each chip having an address input,

(b) a plurality of address busses, one for each of said groups of memory chips, each address bus having a first end and a second end, and each address bus being connected in parallel to the address inputs of all the memory chips in the group in question,
(c) means for applying an address signal in parallel to all the address busses,
(d) first comparator means connected to the first end of each address bus, for comparing the address signal on that bus with the address signal on another one of the address busses, and
(e) second comparator means connected to the second end of each address bus, for comparing the address signal on that bus with a predetermined value.

2. Apparatus according to claim 1 further including logic means for combining outputs of said first and second comparator means to produce overall check signals for the apparatus.

3. Data storage apparatus according to claim 1 further including:
(a) first and second address input paths,
(b) a plurality of multiplexers each having first and second inputs connected respectively to the first and second address input paths, and each having an output, the multiplexers being operable in parallel to select the same address input path, and
(c) means for connecting the output of each multiplexer to a respective plurality of said address busses.

* * * * *